United States Patent
Muck et al.

(10) Patent No.: US 7,432,838 B2
(45) Date of Patent: Oct. 7, 2008

(54) METHOD AND APPARATUS FOR REDUCED POWER CONSUMPTION ADC CONVERSION

(75) Inventors: Markus Muck, Paris (FR); Marc Bernard de Courville, Paris (FR); Patrick Labbe, Anthony (FR)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/554,805

(22) PCT Filed: Apr. 30, 2004

(86) PCT No.: PCT/EP2004/004639

§ 371 (c)(1),
(2), (4) Date: Apr. 4, 2007

(87) PCT Pub. No.: WO2004/098063

PCT Pub. Date: Nov. 11, 2004

(65) Prior Publication Data

US 2008/0030388 A1 Feb. 7, 2008

(30) Foreign Application Priority Data

Apr. 30, 2003 (EP) .................................. 03291060

(51) Int. Cl.
*H03M 1/00* (2006.01)

(52) U.S. Cl. ................... 341/138; 375/240.12; 375/260

(58) Field of Classification Search ................. 341/138; 375/240.12, 260
See application file for complete search history.

(56) References Cited

U.S. PATENT DOCUMENTS

| 4,395,732 | A | 7/1983 | Upton |
| 6,040,861 | A * | 3/2000 | Boroczky et al. ...... 375/240.12 |
| 6,295,013 | B1 | 9/2001 | Barna et al. |
| 6,498,577 | B1 | 12/2002 | Lin |
| 2002/0168016 | A1* | 11/2002 | Wang et al. ................. 375/260 |

OTHER PUBLICATIONS

Ho et al; "Joint Design of a Channel-Optimized Quantizer and Multicarrier Modulation" IEEE Transactions on Communications, vol. 46, No. 10, Oct. 1998.
Vaishampayan "Design of Multiple Description Scalar Quantizers" IEEE Transactions on Information Theory, vol. 39, No. 3, May 1993.
Gersho et al; "Vector Quantization and Signal Compression" 1992 by Kluwer Academic Publishers, USA (month unknown).

* cited by examiner

*Primary Examiner*—Jean B Jeanglaude

(57) ABSTRACT

A method for conversion of signals between analog and digital characterised by; applying a non-linear transfer function to an input signal, such that the relation between the quantisation levels of the converter and the input signal vary as a non-linear function of the magnitude of the input signal. The non-linear transfer function is related to the probability density function of the input signal so that larger quantisation bins of the converter correspond to less probable values of the input signal.

18 Claims, 3 Drawing Sheets

METHOD AND APPARATUS FOR REDUCED POWER CONSUMPTION ADC CONVERSION

RELATED APPLICATIONS

This application is a 371 of PCT/EP04/04639, which has an international filing date of Apr. 30, 2004, designating the United States Of America, and claims the benefit of European Patent Application 03291060.6 filed on Apr. 30, 2003.

TECHNICAL FIELD

This invention relates to the conversion between analog and digital signals.

BACKGROUND

Wireless local area networks (WLANs) are expected to become the main method of conveying data in the near future. However, to provide continuity of service with current or future cellular systems such as GPRS or UMTS, one will need to couple WLAN and cellular systems.

One significant problem foreseen for dual WLAN/cellular terminals is power consumption. Among the various components within a typical mobile terminal that consume significant power is the analog to digital converter (ADC).

In a typical implementation of IEEE802.11a or BRAN HIPERLAN/2 WLAN, two ADCs are required for separate in-phase and quadrature-phase (I/Q) paths.

As an example, Analog Devices manufacture the AD775 ADC, whose specification states that it provides 20 Msamples/sec at 8-bit resolution, requiring 60 mW power—which is described in the specification as 'very low'.

Within the WLAN frameworks mentioned, this equates to a total ADC power consumption of 120 mW.

This level of power consumption will reduce the lifetime of a battery within the terminal as compared with a similar terminal only connected to a cellular network. Possible solutions include using a larger battery, which is likely to result in a larger, heavier terminal, or find means to reduce the power consumption of the ADC within the dual WLAN/cellular terminal.

More generally, lower power consumption within ADCs and to a lesser extent digital to analog converters (DACs) is desirable in many portable devices, such as voice recorders, portable stereos and transceivers.

U.S. Pat. No. 4,395,732 discloses a system in which ADC quantization levels are adapted to a changing distribution of the analogue input signal so that each threshold is statistically as significant as every other threshold and therefore the quantizer's dynamic range is not wasted. In particular, the specification proposes to adapt the ADC quantization levels after each line of a television image. However, there is no description of how a single adaptation is performed; in particular, it is not described what algorithm is used to perform each single adaptation of the thresholds.

The present invention addresses the above problem of reducing ADC/DAC power consumption.

SUMMARY OF THE INVENTION

The present invention provides a method of and apparatus for analog to digital conversion, as described in accompanying claims.

DETAILED DESCRIPTION

Figure 1:
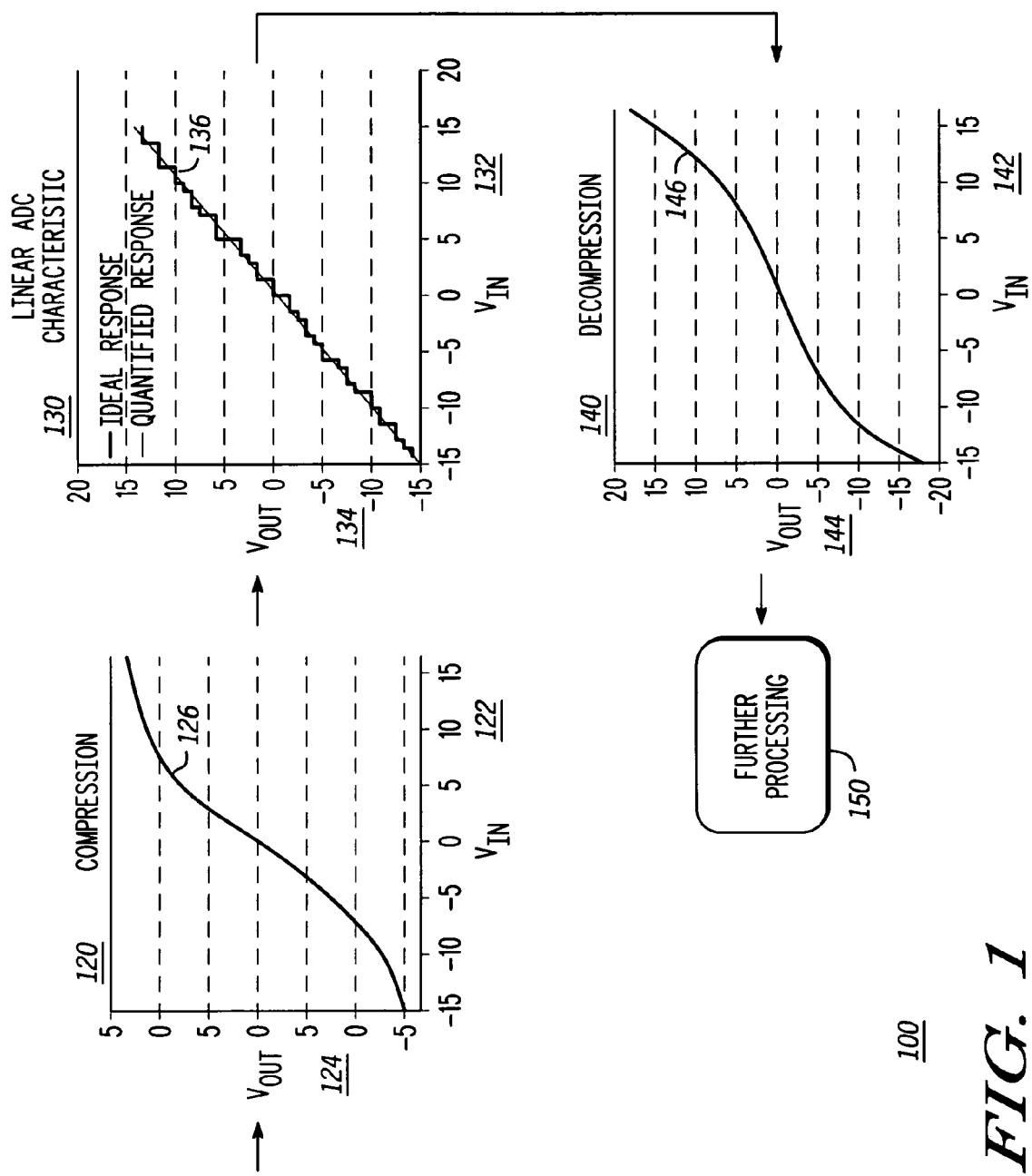
FIG. 1 is a block diagram of an example method of conversion between analog and digital signals.

Within typical ADCs, power consumption is proportional to the number of bits used to quantise the incoming signal. In "Numérisation du signal radiofréquences, Récepteur PCS 1900, Architectures de convertisseurs analogique-numérique pipeline" by Patrick Loumeau and Jean-Francois Naviner (Formation Continue, Ecole Nationale Supérieure des Télécommunications (ENST) Paris, 2002), an empirical power consumption law was given for typical ADC devices as:

$$P = C \cdot F_{data} \cdot 2^{ENOB} \qquad \text{Eq. 1}$$

Where P is the power consumption (for example, in mW), C is a constant, $F_{data}$ is the data output rate (for example, in Mwords/s) and ENOB is the effective number of bits in the quantisation.

The purpose of such an ADC (and conversely, a digital to analogue converter, or DAC) is to represent the values of the incoming signal as accurately as possible. This accuracy is achieved though the number of bits used to quantise the possible value range, with the consequential change in power consumption noted in Equation 1.

Thus to achieve as accurate a representation as possible, ADCs typically use linear quantisation; that is, they divide the value range equally over the available values defined by $2^{ENOB}$. Thus for example if 8 bits are used, then the possible value range is divided into 256 equal bins. Input values falling within the sub-range of a given bin are assigned a quantised level or value, usually the median of the bin's sub-range.

By contrast, within many data communication (source coding) protocols the aim of quantisation is to compress the number of bits used for transmission, with the result that the integrity of the signal suffers some loss. Typically the quantisation process used is highly non-linear, as discussed in "Design of Multiple Description Scalar Quantizers" by Vinay Anant Vaishampayan (IEEE Transactions on Information Theory, 1993) or "Vector Quantization and Signal Compression" by A. Gersho and R. M. Gray (Kluwer Academic Publishers, Norwell, Mass., USA, 1992).

The inventors of the present invention have appreciated, however, that for signal sources with non-uniform probability density distributions (PDD) such as for example orthogonal frequency division multiplexed (OFDM) signals, an ADC may nevertheless employ a non-linearity within the quantisation process such that the associated loss of signal integrity due to compression is concentrated within the lowest probability input value ranges.

In particular, the present invention provides means to constantly adapt the (non-linear) quantisation such that this benefit is maintained in varying input conditions.

This enables a non-linear ADC process to use at least one less effective number of bits to achieve substantially similar bit error rates (BERs) in the final interpreted signal to that of a linear ADC process. The result is an approximate halving in power consumption for the ADC used.

Conversely if the problem of power consumption is alleviated by developments in battery technology, the present invention will improve the BER for a given number of quantisation bits relative to current ADCs. Improved BER for a given number of bits is beneficial for example where the number of possible bits is constrained by other technology that may be coupled to the ADC.

Figure 2:
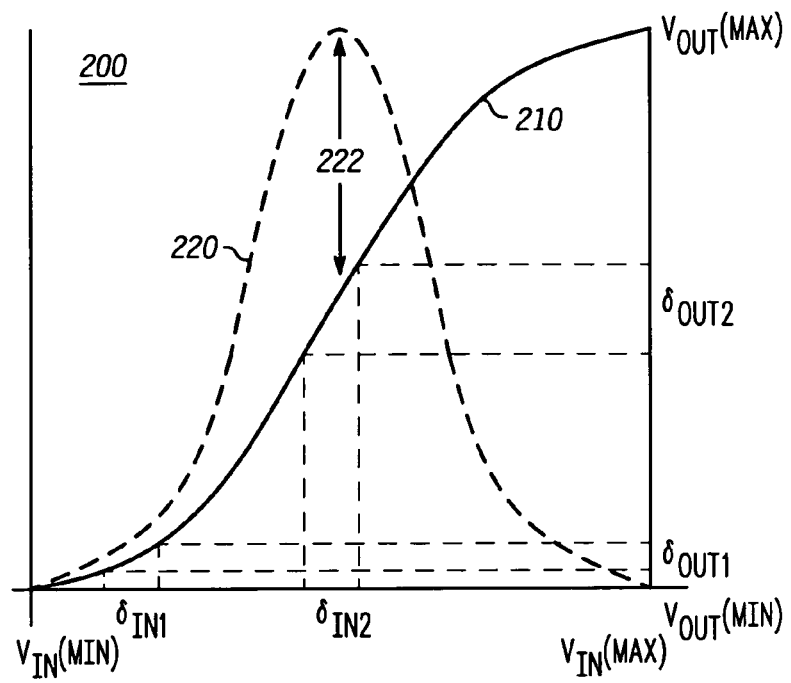
FIG. 2 illustrates a non-linear transfer function and the Gaussian-like gradient thereof.

Referring to FIGS. 1 and 2, consider an input signal passed through an analog device (120) with a non-linear transfer function (126, 210), for example a suitably adapted diode.

The non-linear transfer function of the analog device is predefined as a sigmoid-like function (126, 210) whose gradient is a function of an assumed Gaussian probability density distribution (PDD) (220) for the input signals. Thus the non-linear transfer function has a maximum gradient substantially at the mean of the Gaussian PDD (222), and a gradient approaching zero for values of the Gaussian PDD approaching zero.

The effect is illustrated in FIG. 2, wherein input value intervals $\delta_{in1}$ and $\delta_{in2}$ are identical, but output value interval $\delta_{out1}$ is compressed whilst $\delta_{out2}$ is expanded.

The effect of the non-linear transfer function is thus to expand or compress value intervals in proportion to their probability of occurrence.

The non-linear output of the analog device is then quantised using a linear ADC (130), the linear ADC having at least 1 less bit quantisation accuracy (bins at least twice as large) as would be found in an ADC of a comparable prior system. This provides a power consumption saving of approximately 50% as per equation 1.

As probable input value intervals have been expanded by the non-linearity, they fit the larger quantiser bins much as a linear version of the input would fit smaller quantiser bins. For the compressed, less probable values, the quantiser bins appear proportionally larger, but any resulting inaccuracy is mitigated by the low frequency of occurrence and in the case of OFDM-type transmissions by the low significance of such quantisation errors to final interpreted bit error rate.

The non-linear quantised output of the ADC is then linearised (140), either by computing a function that substantially implements the inverse transfer function of the analog device on the output, or by relating the output to a look-up table of pre-defined values.

The linearised output is then treated as the output of a standard linear ADC (150).

Note that if the output does not need to be treated as the output of a standard linear ADC, for example because the present invention is not being used as a direct substitute for linear ADCs within pre-existing systems, then the linearising means (140) is optional, as subsequent processes may be designed to use the non-linear output.

Clearly, approximations to the aforesaid non-linear transfer function will vary between analog components.

The main disadvantage of the above technique, however, is that the non-linear transfer function of the analog device may only be a crude approximation to the current probability density function of the input.

Figure 4:
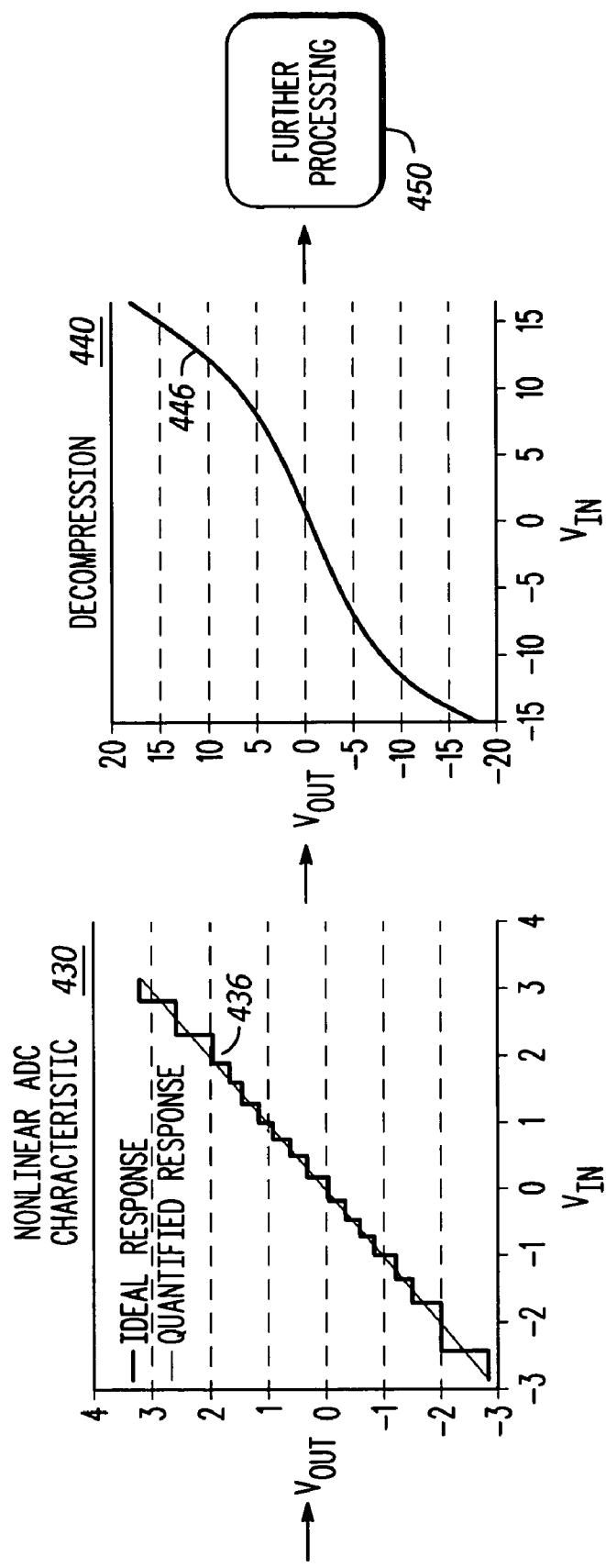
FIG. 4 is a block diagram of a method of conversion between analog and digital signals in accordance with an embodiment of the present invention.

Referring now to FIG. 4, an example non-linear converter is discussed.

Currently, non-linear quantization is used, for example, in the framework of telephone applications (speech quantisation, see for example "Simon Haykin: Communication systems, 4$^{th}$ edition, Wiley & Sons, 2001, chapter 3"). Here, a non-linear compression/decompression device is used in combination with a linear ADC. Such non-linear devices are mainly applied to very simple and very narrow-band applications (e.g. speech coding).

The problem in such applications is that the non-linear compression element increases the bandwidth of the signal (as any non-linear device does). ADC, however, usually have an inherent low-pass filter and thus the signal is distorted by the ADC device. Therefore, the proposed solution is to adapt the quantisation device to the signal distribution.

The inventors of the present invention assume that non-linear ADCs can be manufactured with quantisation bins of varying size within the input range.

Figure 3:
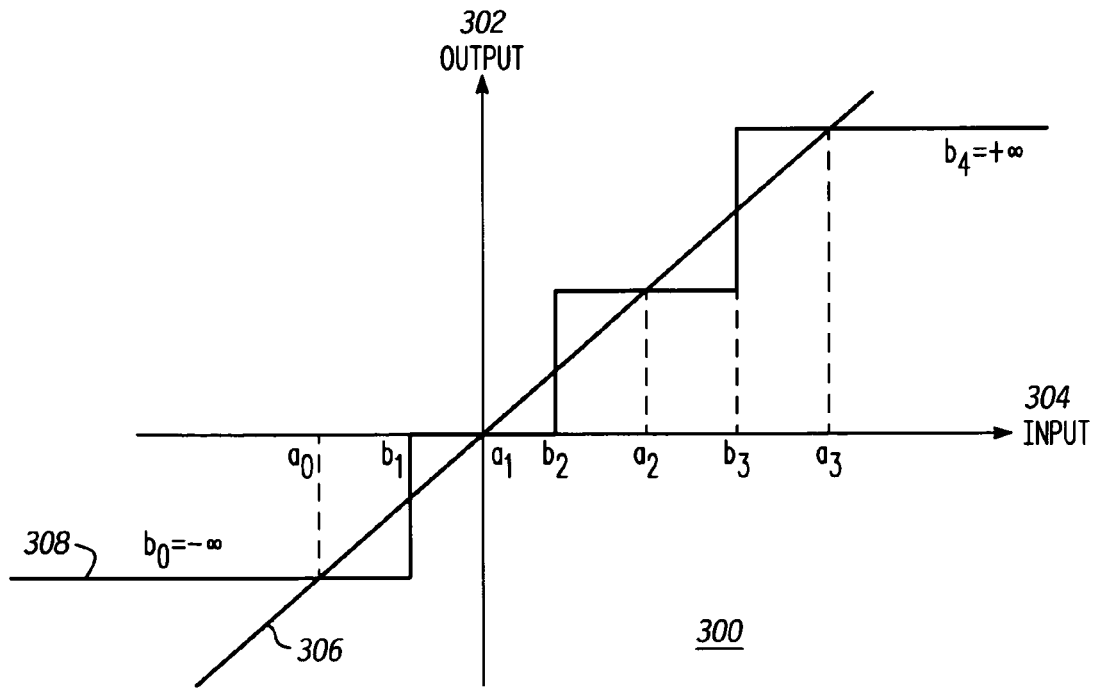
FIG. 3 illustrates quantisation levels and bins as utilised within a converter.

An input signal is passed to a non-linear ADC, within which the quantisation bins are spaced according to the following process:

Referring to FIG. 3, if $b_i$ are the bounding values of the quantiser bins, and $a_i$ are quantiser levels (typically the medians of each bin range), the optimal spacing of the quantisation bins is achieved by minimising the global mean-squared quantisation error (MSE) of the quantiser levels over all individual bins.

Minimising the global MSE is a matter of making bins for probable values of input x smaller to minimise $(x-a_i)^2$ when $b_i < x = b_{i+1}$, at the cost of making improbable value bins larger, until a global minimum MSE over all bins is reached. The probability of values of input x is defined by a probability density function p(x), for example based on a Gaussian function with variance $\sigma^2_g$.

An error function J is defined:

$$J(b_i, b_{i+1}) = \int_{b_i}^{b_{i+1}} (x - a_i)^2 \cdot p(x) \cdot dx \text{ with } b_i = \qquad \text{Eq. 2}$$

$$\frac{1}{2} \cdot (a_i + a_{i+1}) \text{ and choosing } p(x) = \frac{1}{\sqrt{2\pi}\,\sigma_g} \cdot \exp\left\{-\frac{x^2}{2\sigma_g^2}\right\}.$$

Note therefore that the adjustment of the quantiser bin widths $b_i$, $b_{i+1}$ and the adjustment of quantiser levels $a_i$ are interdependent. Expanding Eq. 2 gives the resulting error over one quantisation bin as:

$$J(a_{i+1}, a_i, a_{i+1}) = \frac{\sigma_g^2 + a_i^2}{2} \cdot \left[ \text{erf}\left(\frac{a_i + a_{i+1}}{\sqrt{8}\,\sigma_g}\right) - \text{erf}\left(\frac{a_i + a_{i-1}}{\sqrt{8}\,\sigma_g}\right) \right] + \qquad \text{Eq. 3}$$

$$\sqrt{\frac{2}{\pi}}\,\sigma_g \cdot \exp\left\{-\frac{(a_{i+1} + a_i)^2}{8\sigma_g^2}\right\} \cdot \left(a_i - \frac{a_{i+1} + a_i}{4}\right) -$$

$$\sqrt{\frac{2}{\pi}}\,\sigma_g \cdot \exp\left\{-\frac{(a_{i-1} + a_i)^2}{8\sigma_g^2}\right\} \cdot \left(a_i - \frac{a_{i-1} + a_i}{4}\right)$$

where exp( ) is the exponential function $\exp(m) = e^m$, and erf( ) is the error function $$\text{erf}(m) = \frac{2}{\sqrt{\pi}} \cdot \int_0^m e^{-t^2}\,dt.$$

For N quantisation levels $a_0, \ldots, a_{N-1}$, then excluding the unbounded $a_{-1}$ (which has a lower input value bound of $-\infty$) and similarly $a_N$ with an upper input value bound of $+\infty$, the global MSE for the bounded levels is $$J_{cot} = \sum_{i=0}^{N-1} J(a_{i-1}, a_i, a_{i+1})$$ Eq. 4

The set of quantisation levels $\bar{a}=(a_0, \ldots, a_{N-1})^T$ corresponding to the global minimum of $J_{tot}$ determines the quantisation scheme to be used.

The global minimum can be found by numerical multidimensional optimisation methods, searching a first approximated solution as a polynomial sequence, or other methods of optimising global MSE known in the art.

Similarly, it is clear that p(x) can be chosen according to knowledge/assumptions about the signal type or by using empirical data.

Whilst the above technique provides a superior non-linear transfer function to the previous analog device, it does not provide the means for continuous or even periodic re-estimation of p(x) in case of changes to the nature the input.

PREFERRED EMBODIMENT

Referring again to FIG. 4, a preferred embodiment of the invention utilises programmable non-linear ADCs that can resize any or all of their quantisation bins dynamically. This is of particular value where the input power varies, for example when the input signal has already been passed through an automatic gain control (AGC), which can potentially alter the probability density function of the input signal over time.

In this embodiment an iterative gradient descent process is used to update the quantisation levels. An initial estimation of the quantisation levels $\bar{a}^{(0)}=(a_0^{(0)}, \ldots, a_{N-1}^{(0)})^T$ is chosen. Usually, $\bar{a}^{(0)}=(a_0^{(0)}, \ldots, a_{N-1}^{(0)})^T$ is the optimum set adapted to the distribution of the incoming signal as it occurs in a majority of cases, either taken from stored values as derived previously, or based on a previous update history or by some other estimation means.

An iteration counter k is set to 0.

Taking the previously defined cost function J, then within the expression for $$\frac{\partial J_{a_i}}{\partial a_i},$$

$i=0, \ldots, N-1$, the exp and erf functions are substituted by expressions of their Taylor series about the point $a_i=a_i^{\{k\}}$ (i.e. the current value of $a_i$), preferably only taking the first-order terms of the Taylor series to minimise complexity, although consistent truncation at any order is feasible.

These terms may be either calculated directly, found by pre-computed look-up table, or using approximation as for example given by "Abramowitz and Stegun: Handbook of mathematical functions, Dover publications, New York, 1972").

The substituted expression is given as $$\frac{\partial J_{a_i}^{(k)}}{\partial a_i},$$

The quantisation levels are then updated as follows:
The N linear equations $$\frac{\partial J_{a_i}^{(k)}}{\partial a_i},$$

$i=0, \ldots, N-1$ are resolved independently by substituting all remaining $a_i$ within the equations by the approximate $a_i^{\{k\}}$, resulting in updated quantisation levels $a_i^{\{k+1\}}$, as given below, including special cases for $a_0^{\{k+1\}}$ and $a_{N-1}^{\{k+1\}}$.

$$a_0^{(k+1)} = \sqrt{\frac{2}{\pi}} \cdot \sigma_g \cdot \frac{\exp\left\{-\frac{\left(a_0^{(k)}+a_1^{(k)}\right)^2}{8\sigma_g^2}\right\} \cdot \left(1 + a_0^{(k)} \cdot \frac{a_0^{(k)}+a_1^{(k)}}{4\sigma_g^2}\right)}{\sqrt{\frac{2}{\pi}} \cdot \sigma_g \cdot \frac{a_0^{(k)}+a_1^{(k)}}{4\sigma_g^2} \cdot \exp\left\{-\frac{\left(a_0^{(k)}+a_1^{(k)}\right)^2}{8\sigma_g^2}\right\} - \mathrm{erf}\left(\frac{a_0^{(k)}+a_1^{(k)}}{\sqrt{8}\,\sigma_g}\right) - 1}$$

$$a_{N-1}^{(k+1)} = \sqrt{\frac{2}{\pi}} \cdot \sigma_g \cdot \frac{\exp\left\{-\frac{\left(a_{N-1}^{(k)}+a_{N-2}^{(k)}\right)^2}{8\sigma_g^2}\right\} \cdot \left(1 + a_{N-1}^{(k)} \cdot \frac{a_{N-2}^{(k)}+a_{N-1}^{(k)}}{4\sigma_g^2}\right)}{\sqrt{\frac{2}{\pi}} \cdot \sigma_g \cdot \frac{a_{N-2}^{(k)}+a_{N-1}^{(k)}}{4\sigma_g^2} \cdot \exp\left\{-\frac{\left(a_{N-2}^{(k)}+a_{N-1}^{(k)}\right)^2}{8\sigma_g^2}\right\} - \mathrm{erf}\left(\frac{a_{N-2}^{(k)}+a_{N-1}^{(k)}}{\sqrt{8}\,\sigma_g}\right) + 1}$$ and $$a_i^{(k+1)} = \frac{num_i^{(k+1)}}{denom_i^{(k+1)}}, i=1, 2, \ldots, N-2 \text{ with}$$

$$num_i^{(k+1)} = \sqrt{\frac{2}{\pi}} \cdot \sigma_g \cdot \left[\exp\left\{-\frac{\left(a_i^{(k)}+a_{i-1}^{(k)}\right)^2}{8\sigma_g^2}\right\} \cdot \left(1 + a_i^{(k)} \cdot \frac{a_i^{(k)}+a_{i-1}^{(k)}}{4\sigma_g^2}\right) - \right.$$
$$\left. \exp\left\{-\frac{\left(a_i^{(k)}+a_{i+1}^{(k)}\right)^2}{8\sigma_g^2}\right\} \cdot \left(1 + a_i^{(k)} \cdot \frac{a_i^{(k)}+a_{i+1}^{(k)}}{4\sigma_g^2}\right)\right]$$

$$denom_i^{(k+1)} = \sqrt{\frac{2}{\pi}} \cdot \sigma_g \cdot \left[\exp\left\{-\frac{\left(a_i^{(k)}+a_{i-1}^{(k)}\right)^2}{8\sigma_g^2}\right\} \cdot \frac{a_i^{(k)}+a_{i-1}^{(k)}}{4\sigma_g^2} - \right.$$
$$\left. \exp\left\{-\frac{\left(a_i^{(k)}+a_{i+1}^{(k)}\right)^2}{8\sigma_g^2}\right\} \cdot \frac{a_i^{(k)}+a_{i+1}^{(k)}}{4\sigma_g^2}\right] +$$
$$\mathrm{erf}\left(\frac{a_i^{(k)}+a_{i+1}^{(k)}}{\sqrt{8}\,\sigma_g}\right) - \mathrm{erf}\left(\frac{a_i^{(k)}+a_{i-1}^{(k)}}{\sqrt{8}\,\sigma_g}\right)$$

If the residual error $$J_{res} = \frac{\sum_{i=0}^{N-1} |a_i^{(k+1)} - a_i^{(k)}|^2}{\sum_{i=0}^{N-1} |a_i^{(k)}|^2}$$

is below a threshold $\Delta a$, set $a_i = a_i^{(k+1)}$, $i=0,1, \ldots, N-1$. Otherwise, set $k=k+1$ and repeat the update of the Quantisation levels.

The iterative optimisation process can be left ongoing, periodically re-started or used once during an initialisation period.

The above embodiment is of particular interest in the case of Orthogonal Frequency Division Multiplexed (OFDM) signals, and more generally within systems with high Peak to Average Power Ratios (PAPR) as they typically exhibit input probability distributions to which the embodiments are well suited.

It should be clear to a person skilled in the art that the non-linear transfer function described herein and the predifined and iterative adaptations based thereon are applicable to any Gaussian-like input distribution, and will provide a benefit relative to linear converters for many non-Gaussian input distributions for which a Gaussian approximation is nonetheless superior to a linear one.

The invention claimed is:

1. A method for analog to digital conversion (ADC) comprising:
    applying a non-linear transfer function to an input signal such that the relation between the quantisation levels of the converter and the input signal vary as a non-linear function of the magnitude of the input signal,
    the non-linear transfer function being related to an at least approximate measurement of probability density function 'p(x)' of said input signal so that larger quantisation bins of the converter correspond to less probable values of the input signal,
    wherein an application of the non-linear transfer function to the input signal includes iteratively updating the relation between the non-linear transfer function and the measurement of probability density by updating quantisation levels.

2. A method according to claim 1 for analog to digital conversion in a programmable non-linear analog to digital converter, wherein the iterative relation can be ongoing, periodically re-started or used once during an initialisation period.

3. A method for analog to digital conversion (ADC) comprising:
    applying a non-linear transfer function to an input signal such that the relation between the quantisation levels of the converter and the input signal vary as a non-linear function of the magnitude of the input signal,
    the non-linear transfer function being related to an at least approximate measurement of probability density function 'p(x)' of said input signal so that larger quantisation bins of the converter correspond to less probable values of the input signal,
    wherein an application of the non-linear transfer function to the input signal includes iteratively updating the relation between the non-linear transfer function and the measurement of probability density by updating quantisation levels,
    wherein the non-linear transfer function is applied by pre-defining quantisation levels according to an optimisation process utilising said non-linear transfer function, and wherein for analog to digital conversion in a programmable non-linear analog to digital converter, the optimisation process for predefining quantisation levels reduces a global mean squared quantisation error determined by a cost function for the process, J, being a function of input value probability density function p(x) and the quantisation error for a given quantisation level $a_i$ of corresponding quantisation bin $\{b_i, b_{i+1}\}$, N quantisation levels $\vec{a} = (a_0, \ldots, a_{N-1})^T$ so being updated to reduce the global cost $J_{tot}$, said global cost being a sum of J over N selected quantisation bins, N quantisation levels $\vec{a} = (a_0, \ldots, a_{N-1})^T$ being taken to define the ADC or DAC quantisation arrangement when global cost $J_{tot}$ is below a given threshold.

4. A method according to claim 3 wherein a Gaussian function with variance $\sigma_g^2$ is used as approximation for the input value probability density function.

5. A method according to claim 4 wherein cost function J for a single quantisation bin is substantially equal to $$J(a_{i-1}, a_i, a_{i+1}) = \frac{\sigma_g^2 + a_i^2}{2} \cdot \left[ \text{erf}\left(\frac{a_i + a_{i+1}}{\sqrt{8}\,\sigma_g}\right) - \text{erf}\left(\frac{a_i + a_{i-1}}{\sqrt{8}\,\sigma_g}\right) \right] +$$

$$\sqrt{\frac{2}{\pi}}\,\sigma_g \cdot \exp\left\{-\frac{(a_{i+1} + a_i)^2}{8\sigma_g^2}\right\} \cdot \left(a_i - \frac{a_{i+1} + a_i}{4}\right) -$$

$$\sqrt{\frac{2}{\pi}}\,\sigma_g \cdot \exp\left\{-\frac{(a_{i-1} + a_i)^2}{8\sigma_g^2}\right\} \cdot \left(a_i - \frac{a_{i-1} + a_i}{4}\right)$$

and the global mean square error is substantially equal to $$J_{tot} = \sum_{i=0}^{N-1} J(a_{i-1}, a_i, a_{i+1}).$$

6. A method for analog to digital conversion (ADC) comprising:
    applying a non-linear transfer function to an input signal such that the relation between the quantisation levels of the converter and the input signal vary as a non-linear function of the magnitude of the input signal,
    the non-linear transfer function being related to an at least approximate measurement of probability density function 'p(x)' of said input signal so that larger quantisation bins of the converter correspond to less probable values of the input signal,
    wherein an application of the non-linear transfer function to the input signal includes iteratively updating the relation between the non-linear transfer function and the measurement of probability density by updating quantisation levels, and
    wherein for programmable non-linear ADCs, quantisation levels are updated according to the output of an iterative gradient descent process utilising a cost function J, being a function of input value probability density function p(x) and the quantisation error for a given quantisation level $a_i$ of corresponding quantisation bin $\{b_i, b_{i+1}\}$, the calculation of the gradient of cost function J utilising at least first-order terms of a Taylor series expansion of exponential and error functions about the current quantisation level values.

7. A method according to claim 6 wherein values for terms of Taylor series expansions are provided by a look-up table.

8. A method according to claim 6 wherein values for terms of Taylor series expansions are provided by an approximation function.

9. A method according to claim 6 wherein a Gaussian function with variance $\sigma_g^2$ is used for the input value probability density function.

10. A method according to claim 9 wherein the first bounded quantisation level at iteration step k, $a_0^{\{k\}}$, is updated as $$a_0^{(k+1)} = \sqrt{\frac{2}{\pi}} \cdot \sigma_g \cdot \frac{\exp\left\{-\frac{(a_0^{(k)} + a_1^{(k)})^2}{8\sigma_g^2}\right\} \cdot \left(1 + a_0^{(k)} \cdot \frac{a_0^{(k)} + a_1^{(k)}}{4\sigma_g^2}\right)}{\sqrt{\frac{2}{\pi}} \cdot \sigma_g \cdot \frac{a_0^{(k)} + a_1^{(k)}}{4\sigma_g^2} \cdot \exp\left\{-\frac{(a_0^{(k)} + a_1^{(k)})^2}{8\sigma_g^2}\right\} - \operatorname{erf}\left(\frac{a_0^{(k)} + a_1^{(k)}}{\sqrt{8}\,\sigma_g}\right) - 1}$$

the last bounded quantisation level $a_{N-1}^{\{k\}}$ is updated as $$a_{N-1}^{(k+1)} = \sqrt{\frac{2}{\pi}} \cdot \sigma_g \cdot \frac{\exp\left\{-\frac{(a_{N-1}^{(k)} + a_{N-2}^{(k)})^2}{8\sigma_g^2}\right\} \cdot \left(1 + a_{N-1}^{(k)} \cdot \frac{a_{N-2}^{(k)} + a_{N-1}^{(k)}}{4\sigma_g^2}\right)}{\sqrt{\frac{2}{\pi}} \cdot \sigma_g \cdot \frac{a_{N-2}^{(k)} + a_{N-1}^{(k)}}{4\sigma_g^2} \cdot \exp\left\{-\frac{(a_{N-2}^{(k)} + a_{N-1}^{(k)})^2}{8\sigma_g^2}\right\} - \operatorname{erf}\left(\frac{a_{N-2}^{(k)} + a_{N-1}^{(k)}}{\sqrt{8}\,\sigma_g}\right) + 1} \text{ and}$$

intervening quantisation levels $a_i^{\{k\}}$ are updated as $$a_i^{(k+1)} = \frac{num_i^{(k+1)}}{denom_i^{(k+1)}} \text{ where}$$

$$num_i^{(k+1)} = \sqrt{\frac{2}{\pi}} \cdot \sigma_g \cdot \left[\exp\left\{-\frac{(a_i^{(k)} + a_{i-1}^{(k)})^2}{8\sigma_g^2}\right\} \cdot \left(1 + a_i^{(k)} \cdot \frac{a_i^{(k)} + a_{i-1}^{(k)}}{4\sigma_g^2}\right) - \exp\left\{-\frac{(a_i^{(k)} + a_{i+1}^{(k)})^2}{8\sigma_g^2}\right\} \cdot \left(1 + a_i^{(k)} \cdot \frac{a_i^{(k)} + a_{i+1}^{(k)}}{4\sigma_g^2}\right)\right]$$

and $$denom_i^{(k+1)} = \sqrt{\frac{2}{\pi}} \cdot \sigma_g \cdot \left[\exp\left\{-\frac{(a_i^{(k)} + a_{i-1}^{(k)})^2}{8\sigma_g^2}\right\} \cdot \frac{a_i^{(k)} + a_{i-1}^{(k)}}{4\sigma_g^2} - \exp\left\{-\frac{(a_i^{(k)} + a_{i+1}^{(k)})^2}{8\sigma_g^2}\right\} \cdot \frac{a_i^{(k)} + a_{i+1}^{(k)}}{4\sigma_g^2}\right] +$$

$$\operatorname{erf}\left(\frac{a_i^{(k)} + a_{i+1}^{(k)}}{\sqrt{8}\,\sigma_g}\right) - \operatorname{erf}\left(\frac{a_i^{(k)} + a_{i-1}^{(k)}}{\sqrt{8}\,\sigma_g}\right)$$

all terms as defined herein.

11. A method according to claim 6 wherein convergence of the iterative gradient descent process is only sought once during an initialisation phase.

12. A method according to claim 1 wherein the output of the converter is linearised by application of a nonlinear transfer function being substantially the inverse of the non-linear transfer function applied to the input signal.

13. Apparatus for analog to digital conversion comprising:
a non-linear transfer function module for applying a non-linear transfer function to an input signal such that the relation between the quantisation levels of the converter and the input signal vary as a non-linear function of the magnitude of the input signal,
the non-linear transfer function module being responsive to an at least approximate measurement of probability density function 'p(x)' of said input signal so as to relate thereto the non-linear transfer function so that larger quantisation bins of the converter correspond to less probable values of the input signal,
wherein the non-linear transfer function module, is operative, for an application of the non-linear transfer function to the input signal, to iteratively update the relation between the non-linear transfer function and the measurement of probability density by updating quantisation levels.

14. Apparatus according to claim 13 comprising a communication system.

15. Apparatus according to claim 13 comprising a communication system where signals with high Peak-To-Average-Power Ratio (PAPR) amplitudes occur.

16. Apparatus according to claim 13 comprising a communication system utilising a multi-carrier modulation scheme.

17. Apparatus according to claim 13 comprising a communication system utilising orthogonal frequency division multiplexing.

18. Apparatus according to claim 13 comprising a mobile station.

* * * * *